United States Patent [19]

Lind

[11] 4,350,748
[45] Sep. 21, 1982

[54] ELECTROPHOTOGRAPHIC PROCESS FOR THE MANUFACTURE OF PRINTING FORMS OR PRINTED CIRCUITS INCLUDING TRANSFER OF PHOTOCONDUCTIVE COATING FROM TEMPORARY SUPPORT

[75] Inventor: Erwin Lind, Wiesbaden, Fed. Rep. of Germany

[73] Assignee: Hoechst Aktiengesellschaft, Fed. Rep. of Germany

[21] Appl. No.: 278,665

[22] Filed: Jun. 29, 1981

[30] Foreign Application Priority Data

Jun. 30, 1980 [DE] Fed. Rep. of Germany ....... 3024718

[51] Int. Cl.³ .................... G03G 13/32; G03G 13/26
[52] U.S. Cl. ........................... 430/49; 430/130; 430/131; 430/133; 430/134; 430/66; 430/67; 430/69; 101/401.1
[58] Field of Search ............... 430/130, 131, 133, 134, 430/313, 49, 66, 67, 69; 101/401.1

[56] References Cited

U.S. PATENT DOCUMENTS 3,469,982  9/1969  Celeste ............................ 430/256
4,066,453  1/1978  Lind et al. ......................... 430/49

FOREIGN PATENT DOCUMENTS 2322047  11/1974  Fed. Rep. of Germany .
1465926   3/1977  United Kingdom .

*Primary Examiner*—John D. Welsh
*Attorney, Agent, or Firm*—James E. Bryan

[57] ABSTRACT

This invention relates to an improvement in the process for the manufacture of printing forms and printed circuits by coating an electrically conductive support with an organic photoconductor layer and by charging, exposing, and developing the electrostatic image by means of a finely particulate toner, fixing and dissolving the layer away from the non-image areas by means of a decoating medium and, if appropriate, etching of the bared support surface, the improvement which comprises, for the purpose of coating, transferring the organic photoconductor layer on a temporary support to the electrically conductive support with the aid of heat and pressure.

9 Claims, No Drawings

ELECTROPHOTOGRAPHIC PROCESS FOR THE MANUFACTURE OF PRINTING FORMS OR PRINTED CIRCUITS INCLUDING TRANSFER OF PHOTOCONDUCTIVE COATING FROM TEMPORARY SUPPORT

This invention relates to a process for the manufacture of printing forms or printed circuits by coating an electrically conductive support with an organic photoconductor layer and by charging, exposing, and developing the electrostatic image by means of a finely particulate toner, fixing and dissolving the layer away from the non-image areas by means of a decoating medium and, if appropriate, etching of the bared support surface.

In general, the materials which are to be used for electrophotographic purposes and are to be coated with a photoconductor, are electrically conductive and are composed of metals, such as aluminum, copper, zinc or magnesium, or their surface is composed of metal compounds, such as aluminum oxide, zinc oxide, indium oxide or copper iodide or their surface has been treated with an antistatic agent. In practice, the materials which are to be coated are predominantly present in the form of plates or films. Hitherto, it has been customary to provide these materials with an electrophotographic layer by lacquering, and it was necessary for the preparation of the lacquer to dissolve the organic photoconductor in organic solvents, if appropriate together with binders and further additives, as is known from German Offenlegungsschrift No. 2,322,046 or 2,322,047, for the preparation of printing forms or metallic etch images. The solution was applied by machine and the solvent was subsequently evaporated under the action of heat. Where it was possible to carry out the coating on a large industrial scale, the disposal of the solvent vapors was not a technical problem, nor does it represent a significant cost factor. Thus, for example, electrophotographic printing plates with aluminum as the support material are mass-produced in high quality and by a process which does not pollute the environment. On the other hand, the processor of electrophotographic materials will wish to carry out the coating himself, because of the given course of the process or for cost reasons. In these cases, electrophotographic materials are required in a quantity which does not justify factory-type coating involving expensive solvent recovery or disposal.

It is therefore the object of the invention, to provide a process for the manufacture of printing forms or printed circuits by an electrophotographic method, which process enables the coating to be carried out in a simple manner without pollution of the environment and without the use of a solvent, if possible immediately before the further processing of the material.

The starting point for the achievement of this object is a process wherein, for the purpose of coating, an organic photoconductor layer on a temporary support is transferred to an electrically conductive support with the aid of heat and pressure. In a preferred embodiment, the temporary support used is a plastic film, such as a polyester film which, for example, is composed of polyethylene terephthalate, and the photoconductor layer is transferred at transfer temperatures in the range from 100° to 180° C. under a pressure of from 2 to 10 bars.

A transfer process of this type is known from German Auslegeschrift No. 1,522,515, for the manufacture of photographic, relief-type recordings, wherein a photopolymerizable material in the form of a light-sensitive layer is transferred from a temporary to a permanent layer support. In this process, it was found that the photochemical properties of the light-sensitive substances are not adversely affected by the transfer process. It was not possible, however, to deduce from this that, in a photophysical process, such as the electrophotographic process for the manufacture of printing forms or printed circuits, the transfer can be carried out in the same way without adversely affecting the electrophotographic properties. In addition to the light-sensitivity, a slight discharge in the dark of the charged photoconductor layer plays an exceedingly important role in the manufacture of the printing forms, because a certain time from about half a minute up to several minutes elapses between the charging and the development of the latent charge image produced. If the discharge in the dark is excessive, the attenuation of the charge image taking place before toner is applied would be so extensive that perfect coverage with toner, which is absolutely necessary for the later removal of coating, is no longer obtained. Moreover, as a result of thermal stress exerted on a photoconductor layer during the transfer, it was feared that charge carriers which effect an excessive discharge of the photoconductor layer in the dark would be generated irreversibly. With respect to the light-sensitivity of the photoconductor layer, there was concern that the activators or sensitizers used also would be affected by the action of heat during the transfer process, so that the resulting light-sensitivity would be lower.

Surprisingly, it was found that an organic solvent-free photoconductor layer can be transferred by the action of heat and under pressure from a temporary support to an electrically conductive support, without the electrophotographic properties, such as the charging capacity, discharge in the dark and sensitivity, or other physical properties, such as the solubility thereby being modified. This was recognized as a possible method of applying electrophotographic layers to the materials intended for further processing, without the aid of organic solvents, at the place of further processing, for example in reprographic establishments or printing plants. The problem of solvent disposal or pollution of the environment by solvent vapors thus does not rise. The organic photoconductor layers required for carrying out the process can, together with the temporary support, be manufactured in factories on a large scale by hitherto customary processes, it being possible for the solvents thus obtained to be recovered economically and quantitatively.

When carrying out the process according to the invention, known electrophotographic layers are initially applied in a machine, by lacquering in a defined thickness and with excellent uniformity, to a film material suitable as the temporary support. At the place of processing, the layers then can be transferred with the aid of heat and pressure, and without a loss in quality, from the film to the material which is to be processed.

Plastic films, preferably polyester films, such as those composed of polyethylene terephthalate, are suitable as a satisfactory temporary support material; the surface of these can be pretreated, for example with commercially available release agents based on silicone.

Because the process according to the invention is predominantly used for the manufacture of electrophotographic printing forms or printed circuits, the transfer of the photoconductor layer can be carried out in a device which, in the simplest case, comprises a pair of heated rollers. The roller temperatures required for the transfer of the photoconductor layer depend, of course, on the thermoplastic properties of the photoconductor layer which is to be transferred. These temperatures are as a rule between 100° and 180° C. During the transfer, it is advantageous to apply a pressure of a few bars, in addition to heating. Furthermore, it is possible to fix the conditions for a perfect transfer of the photoconductor layer by setting a defined speed of passage through the pair of rollers. The transfer conditions also include the adhesive properties and, because of the heating, the thickness of the material to which the organic photoconductor layer is to be transferred.

The examples which follow illustrate in more detail how the process is performed and used.

EXAMPLE 1

A solution of 20 g of 2,5-bis-(4'-diethylaminophenyl)-1,3,4-oxadiazole, 20 g of a copolymer of styrene and maleic anhydride, and 0.05 g of Rhodamine B extra in 200 ml of glycol monomethyl ether and 50 ml of butyl acetate is machine applied to a 100 μm thick polyester film in such a way that, after evaporation of the solvent, a layer of about 5 μm thickness is formed. The electrophotographic layer so prepared is used for the production of a printed circuit. The procedure for this is as follows:

A copper surface, which is to be provided with an image, of a printed circuit board in the form of a copper-laminated plastic plate, is covered with the coated polyester film in such a way that the layer side lies on the copper. The material as a whole is then passed at a speed of 0.5 m/minute through a pair of rollers which is heated to 170° C. and comprises an electrically heated metal roller and a back-pressure roller which is coated with polytetrafluoroethylene, the pressure between the two rollers being about 10 bars. After it has passed through the pair of rollers, the polyester film is peeled off of the printed circuit board. The photoconductor layer firmly adheres to the copper surface.

After the photoconductor layer has been charged in the dark with the aid of a corona to a surface potential of $-400$ V, an image in the form of the circuit track is produced by exposure. Upon contact exposure, the exposure time is 10 seconds when a 100 W incandescent lamp at a distance of 65 cm is used. The latent charge image produced is developed with a liquid developer, such as is described in French Patent No. 7,414,841. For this purpose, 1.5 g of a hard-grade bitumen having a softening point of 130°-140° C. are dispersed in a solution of 6.5 g of a pentaerythritol resin ester in 1,000 ml of an isoparaffin having a boiling range between 185° and 210° C. The development is carried out in a photographic dish. After development, the excess developer fluid is allowed to run off and evaporate.

The photoconductor layer is then removed from the areas not covered with toner by dissolving it away, by means of immersing the material for 60 seconds in a solution of 50 g of $Na_2SiO_3.9H_2O$ in 250 g of glycerol (86 percent concentration), 390 g of ethylene glycol and 310 g of methanol. The incipiently dissolved photoconductor layer is flushed away by means of a strong water jet, and remaining non-image areas are rubbed out by means of a dabber, if necessary.

To produce a printed circuit, the copper layer of the printed circuit board, which is now bared, is then removed by means of a commercially available etching solution. What remains is a copper circuit track which is covered with toner and photoconductor layer. The circuit track can be readily bared by an after-treatment with an organic solvent.

EXAMPLE 2

30 g of a condensation product obtained from 3-bromopyrene and formaldehyde, 15 g of a terpolymer composed of 60 percent of n-hexyl methacrylate, 10 percent of styrene and 30 percent of methacrylic acid having an acid number of 180, and 1.6 g of 9-dicyanomethylene-2,7-dinitrofluorene are dissolved in 300 ml of tetrahydrofuran. A polyester film which was pretreated with a silicone release agent is coated with the solution in such a way that a layer of 5 μm thickness remains after the evaporation of the tetrahydrofuran. The resulting film material contains an electrophotographic layer which can be transferred, by the action of heat and under pressure to a printing plate support which is to be coated.

The procedure for this is as follows: An aluminum foil with a mechanically roughened surface is covered with the coated polyester film in such a way that the photoconductor layer lies on the roughened aluminum surface. The further procedure is as described in Example 1, and the material is passed through a pair of rollers heated to 150° C., a roller pressure of 6 bars being sufficient. After removal of the polyester film, an electrophotographic planographic printing form with a layer containing the condensation product of 3-bromopyrene and formaldehyde as the photoconductor is obtained.

The plate is provided with an image and converted into a printing form in a known manner by charging, exposing, applying toner, fixing and removal of the photoconductor layer from the image-free areas by dissolving it away, the solution described in Example 1 being used.

EXAMPLE 3

A solution of 16 g of 2-vinyl-4-(2'-chlorophenyl)-5-(4''-diethylaminophenyl)-oxazole, 24 g of a copolymer of styrene and maleic anhydride and 0.4 g of Astrazonorange R (C.I 48,040) in 120 ml of glycol monomethyl ether, 190 ml of tetrahydrofuran and 50 ml of butyl acetate, is applied to a 75 μm thick polyester film, on which aluminum has been vapor-deposited, in such a way that a 5 μm thick layer remains after evaporation of the solvents. The film obtained constitutes a coating material, which can be readily handled, for the coating of printing plate support materials.

This film is used for preparing an electrophotographic printing plate by laying the layer side of the film onto an aluminum plate which has been electrochemically roughened, anodized and pretreated with polyvinylphosphonic acid and by passing it under a pressure of 6 bars through a pair of rollers heated to 170° C., as already described in Example 1. After cooling, the polyester film with vapor-deposited aluminum is peeled off.

The plate is charged in the dark to $-400$ V with the aid of a corona and is exposed imagewise by means of a modulated 10 mW argon ion laser. Developing of the latent image with a dry toner, fixing and conversion into a printing form by dissolving the photoconductor layer away from the image-free areas are carried out in known manner. This gives a printing form of high stability during the printing run which can be used in newspaper printing.

It will be obvious to those skilled in the art that many modifications may be made within the scope of the present invention without departing from the spirit thereof, and the invention includes all such modifications.

What I claim is:

1. In the process for the manufacture of printing forms and printed circuits by coating an electrically conductive support with an organic photoconductor layer and by charging, exposing, and developing the electrostatic image by means of a finely particulate toner, fixing and dissolving the layer away from the non-image areas by means of a decoating medium and, if appropriate, etching of the bared support surface; the improvement which comprises, for the purpose of coating, transferring the organic photoconductor layer on a temporary support to the electrically conductive support with the aid of heat and pressure.

2. A process as claimed in claim 1 wherein the temporary support used is a plastic film.

3. A process as claimed in claim 2 wherein the plastic film used is a polyester film.

4. A process as claimed in claim 1 wherein the organic photoconductor layer is transferred at transfer temperatures in the range of 100° to 180° C.

5. A process as claimed in claim 1 wherein the organic photoconductor layer is transferred under a pressure of 2 to 10 bars.

6. A process as claimed in claim 1 wherein the electrically conductive support is a metal plate or metal foil.

7. A process as claimed in claim 6 wherein the electrically conductive support is a copper-laminated plastic plate.

8. A process as claimed in claim 6 wherein the electrically conductive support is an aluminum foil with a mechanically roughened surface.

9. A process as claimed in claim 6 wherein the electrically conductive support is an aluminum plate which has been electrochemically roughened, anodized and pretreated with polyvinylphosphonic acid or with silicate.

* * * * *